(12) United States Patent
Chin et al.

(10) Patent No.: US 9,104,383 B2
(45) Date of Patent: Aug. 11, 2015

(54) PROGRAMMABLE CONTROLLER COMPONENT WITH ASSEMBLY ALIGNMENT FEATURES

(71) Applicant: Rockwell Automation Technologies, Inc., Mayfield Heights, OH (US)

(72) Inventors: Karen Chin, Singapore (SG); Chee Lim Wong, Singapore (SG)

(73) Assignee: Rockwell Automation Technologies, Inc., MayField Heights, OH (US)

( * ) Notice: Subject to any disclaimer, the term of this patent is extended or adjusted under 35 U.S.C. 154(b) by 0 days.

(21) Appl. No.: 14/513,655

(22) Filed: Oct. 14, 2014

(65) Prior Publication Data

US 2015/0029662 A1    Jan. 29, 2015

Related U.S. Application Data

(62) Division of application No. 13/281,277, filed on Oct. 25, 2011, now Pat. No. 8,902,598.

(30) Foreign Application Priority Data

Oct. 28, 2010   (SG) .............................. 201007962-2

(51) Int. Cl.
*H05K 5/00* (2006.01)
*H05K 7/16* (2006.01)
(Continued)

(52) U.S. Cl.
CPC .............. *G06F 1/182* (2013.01); *H05K 7/1467* (2013.01); *Y10T 29/49002* (2015.01)

(58) Field of Classification Search
CPC ... H05K 7/142; H05K 7/1467; H05K 7/1474; G06F 1/182
USPC ......... 361/752, 679.4, 679.04, 725, 727, 735, 361/790, 679.58, 679.02; 174/50; 29/592.1, 29/529
See application file for complete search history.

(56) References Cited

U.S. PATENT DOCUMENTS 4,433,886 A * 2/1984 Cassarly et al. ................ 439/65
5,099,391 A * 3/1992 Maggelet et al. ............. 361/736
(Continued)

FOREIGN PATENT DOCUMENTS

CN             102395253          3/2012

OTHER PUBLICATIONS

Search Report & Written Opinion for Singapore Patent Applicaiton No. 201007962-2 issued Sep. 17, 2013.
(Continued)

*Primary Examiner* — Timothy Thompson
*Assistant Examiner* — Rhadames J Alonzo Miller
(74) *Attorney, Agent, or Firm* — Fletcher Yoder, P.C.

(57) ABSTRACT

A programmable logic controller (PLC) assembly includes a bottom housing with a base, a first plurality of elongate alignment features extending from the bottom housing transverse to the base, and a first connection feature. The PLC assembly includes a central processing unit with a circuit board and at least two receptacles therethrough configured to engage and slide along at least two of the first plurality of alignment features. The at least two of the first plurality of alignment features are positioned asymmetrically with respect to the base. The PLC assembly includes an upper housing with a second connection feature configured to slidably couple with the first connection feature and a second plurality of elongate alignment features configured to slidably engage at least two of the first plurality of alignment features, which are positioned asymmetrically with respect to the base.

20 Claims, 10 Drawing Sheets

(51) Int. Cl.
*G06F 1/18* (2006.01)
*H05K 7/14* (2006.01)

(56) References Cited

U.S. PATENT DOCUMENTS

| | | | | |
|---|---|---|---|---|
| 5,155,664 | A | * | 10/1992 | Holterman et al. ........ 361/679.6 |
| 5,157,590 | A | * | 10/1992 | Barthel et al. ................ 361/825 |
| 5,808,876 | A | * | 9/1998 | Mullenbach et al. ......... 361/788 |
| 5,898,575 | A | * | 4/1999 | Hawthorne et al. ........... 361/809 |
| 6,015,302 | A | * | 1/2000 | Butts et al. ................... 439/76.2 |
| 6,152,758 | A | * | 11/2000 | Matsuoka ..................... 439/364 |
| 6,239,986 | B1 | | 5/2001 | Otsuka |
| 6,324,057 | B1 | * | 11/2001 | Baran et al. ................... 361/690 |
| 6,331,935 | B1 | * | 12/2001 | Baran ....................... 361/679.41 |
| 6,418,027 | B1 | * | 7/2002 | Suzuki et al. ................. 361/729 |
| 6,435,897 | B1 | * | 8/2002 | Paul et al. ..................... 439/374 |
| 6,456,495 | B1 | * | 9/2002 | Wieloch et al. ............... 361/729 |
| 6,511,328 | B2 | * | 1/2003 | Molus et al. .................. 439/76.1 |
| 7,040,913 | B2 | * | 5/2006 | Parsadayan ................... 439/374 |
| 7,476,802 | B2 | * | 1/2009 | Cane et al. ....................... 174/50 |
| 2002/0072268 | A1 | * | 6/2002 | Hoelscher et al. ............ 439/374 |
| 2004/0029429 | A1 | * | 2/2004 | Parsadayan ................... 439/374 |
| 2004/0102097 | A1 | | 5/2004 | Clark et al. |
| 2005/0228507 | A1 | | 10/2005 | Dachs et al. |
| 2005/0286237 | A1 | * | 12/2005 | Barile et al. .................. 361/728 |
| 2006/0099845 | A1 | | 5/2006 | Rubio |
| 2007/0246256 | A1 | * | 10/2007 | Eusterholz et al. ........... 174/520 |
| 2008/0038877 | A1 | | 2/2008 | Wang et al. |
| 2009/0027843 | A1 | * | 1/2009 | Roesner ........................ 361/683 |

OTHER PUBLICATIONS

Office Action for Chinese Patent Application No. 2011103388665.5 issued Feb. 8, 2014.

* cited by examiner

PROGRAMMABLE CONTROLLER COMPONENT WITH ASSEMBLY ALIGNMENT FEATURES

CROSS REFERENCE TO RELATED APPLICATIONS

This application is a divisional of U.S. application Ser. No. 13/281,277, filed on Oct. 25, 2011, which claims priority from and the benefit of Singapore Application No. 201007962-2, filed on Oct. 28, 2010, entitled "Programmable Controller Component with Assembly Alignment Features," each of which is herein incorporated by reference.

BACKGROUND

The invention relates generally to industrial automation and control systems, such as those used in industrial and commercial settings. More particularly, embodiments of the present invention relate to techniques for providing a programmable controller assembly with features that facilitate alignment of components of the programmable controller during assembly.

Industrial automation and control systems are known and are in use for controlling factory automation and the like. Such systems typically include various components that cooperate to monitor and control a process and/or system (e.g., a manufacturing process or a machine). A programmable controller is typically a central feature of a control system. For example, a typical control system includes one or more programmable logic controllers that coordinate with sensors, semiconductor power electronic circuits, power supplies, motor starters, relays, and so forth to control features and actions throughout an associated system or process. In operation, a typical programmable logic controller examines a series of inputs reflecting the status of a controlled process and changes outputs affecting control of the controlled process. For example, a programmable logic controller may receive an analog signal from a sensor and adjust an output to an actuator based on a value of the signal and associated logic programmed in a memory of the controller.

A typical programmable controller includes several major components that are separately manufactured and then assembled together. For example, a typical programmable controller includes housing components and at least one circuit board. These components are typically manually aligned during assembly so that screws can be passed through openings in one or more of the components to hold the assembly together.

BRIEF DESCRIPTION

In accordance with one embodiment, a programmable logic controller assembly for facilitating assembly of a programmable logic controller is provided. The programmable logic controller assembly includes a bottom housing that has a base, a first plurality of elongate alignment features extending from the bottom housing in a direction transverse to the base, and a first connection feature. The programmable logic controller assembly also includes a central processing unit that has a circuit board and at least two receptacles through the circuit board configured to engage and slide along at least two of the first plurality of alignment features, wherein the at least two of the first plurality of alignment features are positioned asymmetrically with respect to the base. Further, the programmable logic controller assembly includes an upper housing with a second connection feature configured to slidably couple with the first connection feature and a second plurality of elongate alignment features configured to slidably engage at least two of the first plurality of alignment features, wherein the at least two of the first plurality of alignment features are positioned asymmetrically with respect to the base.

In another embodiment, a programmable logic controller is provided. The programmable logic controller includes a bottom housing comprising a base, a first plurality of alignment features, and a first plurality of attachment features. Additionally, the programmable logic controller includes an upper housing comprising a second plurality of alignment features and a second plurality of attachment features, wherein a first pair of the second plurality of alignment features are slidably engaged with a first pair of the first plurality of alignment features and wherein the first pair of the first plurality of alignment features are asymmetrically positioned relative to the base, and wherein a first pair of the first plurality of attachment features is coupled with a first pair of the second plurality of attachment features. Further, the programmable logic controller includes a central processing unit board positioned between the lower housing and the upper housing, the central processing unit board comprising a first pair of receptacles coupled about a second pair of the first plurality of alignment features, wherein the second pair of the first plurality of alignment features are asymmetrically positioned relative to the base.

Present embodiments also include a method of assembling a programmable controller. The method includes aligning at least two receptacles in an input/output board with at least two alignment projections extending from a base of a bottom housing in a direction transverse to the base, wherein the at least two alignment projections are positioned asymmetrically with respect to the base, and directing the input/output board slidably along the at least two alignment projections until components of the input/output board engage with abutment or coupling features of the bottom housing. Additionally, the method includes aligning at least two receptacles in a central processing unit board with at least two projections extending from the base and directing the central processing unit board slidably along the at least two projections until a connector of the input/output board couples with a connector of the central processing unit board. Further, the method includes aligning at least two alignment features of an upper housing with at least two alignment features of the bottom housing, and directing the upper housing slidably along the at least two alignment features of the bottom housing until a coupling feature of the upper housing interlocks with a coupling feature of the bottom housing, wherein the at least to alignment features of the bottom housing are asymmetrically positioned with respect to the base.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

It is now recognized that it is desirable to provide a programmable controller assembly that includes features that facilitate alignment and coupling of assembly components. As discussed in detail below, embodiments of the present technique function to provide an interlocking system for assembling and connecting components of a programmable logic controller of an industrial control and automation system. In particular, the present technique provides features or components of a programmable logic controller that include alignment and/or auto-locking mechanisms that facilitate assembly of such modules without the use of tools.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
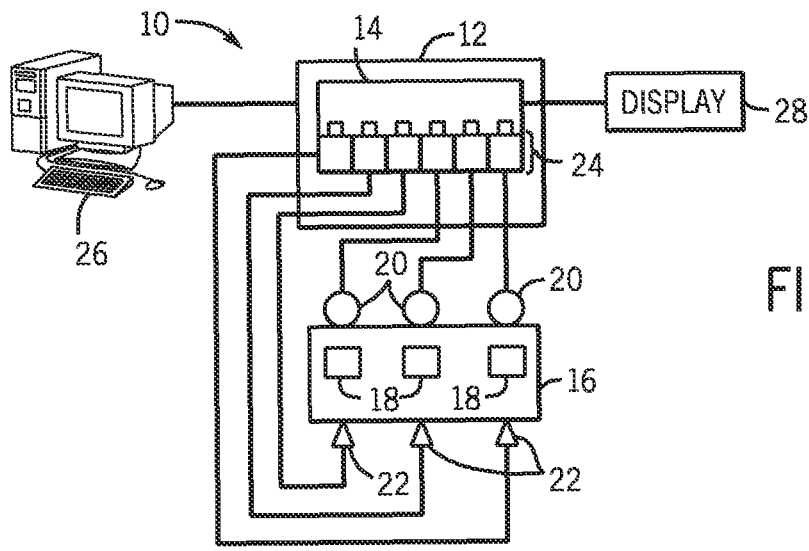
FIG. 1 illustrates a schematic view of an industrial automation and control system in accordance with aspects of the present technique.

Turning now to the drawings and referring first to FIG. 1 an exemplary industrial automation and control system 10 is illustrated. The system 10 includes an enclosure 12, such as an electrical cabinet, in which electrical components such as monitoring and/or control components are housed. Example components in the unit may include relays, motor starters, and programmable logic controllers (PLC), among others. The enclosure 12 may be suitable, for example, for assembly of a motor control center or use with industrial, commercial, marine, or other electrical systems. The enclosure 12 may be made of any suitable material, such as heavy gage sheet metal, reinforced plastics, and so forth. In certain embodiments, the enclosure 12 includes individual compartments or other structures that support the electrical components.

In the illustrated embodiment, the system 10 includes a programmable controller 14 including assembly features that have been assembled in accordance with present techniques. The programmable controller 14 may be configured to monitor and/or control a machine or system, as represented by process 16, via an interface with components of the process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components generally represented by reference numeral 18, such as electric motors, valves, actuators, temperature elements, pressure components, or a myriad of manufacturing, processing, material handling and other applications. Further, the process 16 may comprise control and monitoring equipment for regulating process variables through automation and/or observation. For example, the illustrated process 16 comprises sensors 20 and actuators 22. The sensors 20 may comprise any number of devices adapted to provide information regarding process conditions, such as pressure and temperature sensors or discrete indicators. The actuators 22 may include any number of devices adapted to perform a mechanical action in response to an input signal, such as automated valves.

As illustrated, these sensors 20 and actuators 22 are in communication with the programmable controller 14 (e.g., a PLC or monitoring station). In one embodiment, the sensors 20 and actuators 22 may communicate with the programmable controller 14 via one or more I/O modules 24 integral with or coupled to the programmable controller 14. The I/O modules 24 may be features of an I/O board and may transfer input and output signals between the programmable controller 14 and the process 16. In some embodiments, the I/O modules 24 are integral with the programmable controller 14 and facilitate communication of external devices with a central processing unit of the programmable controller 14. In certain embodiments, these devices (sensors 20 and actuators 22) may be utilized along with the programmable controller 14 to operate process equipment. Indeed, they may be utilized within process loops that are monitored and controlled by aspects of the process 16. Such a process loop may be activated based on process inputs (e.g., input from a sensor 20) or direct operator input received through a user interface device 26.

The I/O modules 24 may be integrated with the programmable controller 14, or may be added or removed via expansion slots, bays or other suitable mechanism. For example, to add functionality to the programmable controller 14, additional I/O modules 24 may be added, such as if new sensors 20 or actuators 22 are added to control the machine, system, or process 16. These I/O modules 24 serve as an electrical interface to the programmable controller 14 and may be located proximate or remote from the programmable controller 14 including in remote network interfaces to associated systems. The I/O modules 24 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O modules 24 may convert between AC and DC analog signals used by devices on a controlled machine or process and +5-volt DC logic signals used by the programmable controller 14. Additionally, some of the I/O modules 24 may provide digital signals to digital I/O devices and received digital signals from digital I/O devices. Further, in some embodiments, the I/O modules 24 that are used to control motion devices or process control devices may include local microcomputing capability on the I/O module. In some embodiments, data is communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet, or other network protocols (Foundation Fieldbus (H1 and Fast Ethernet) Modbus TCP, Profibus) and also communicate to higher level computing systems In the illustrated embodiment, the system 10 also includes a display 28 such as a liquid crystal display (LCD) or other display. The display 28 may be configured to display output parameters such as operating parameters of the process/system 16, temperature and pressures sensed by the sensors 20, position information of the actuators 22, alarm information, and so forth.

Figure 2:
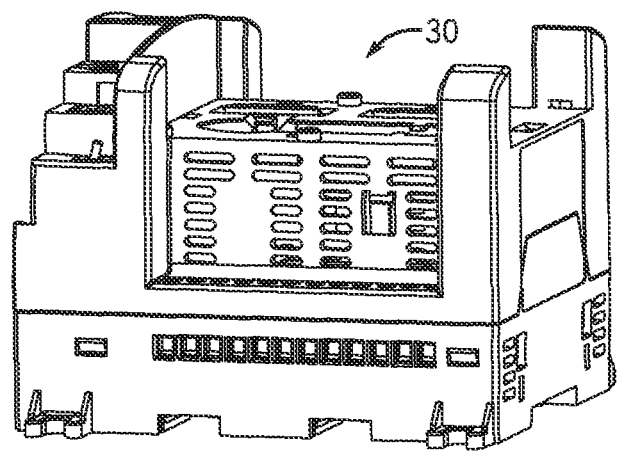
FIG. 2 is a perspective view of a programmable controller including assembly features in accordance with present embodiments.
Figure 3:
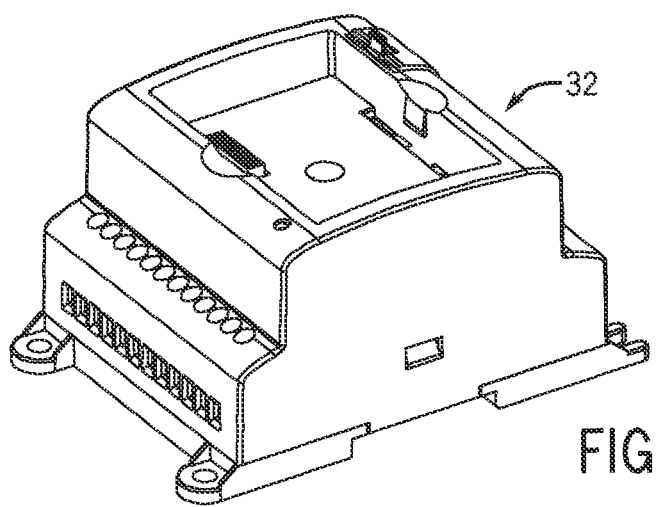
FIG. 3 is a perspective view of a programmable controller including assembly features in accordance with present embodiments.

FIGS. 2 and 3 are perspective views of a programmable controller 30 and a programmable controller 32, respectively, each of which includes assembly features in accordance with present embodiments. The various components of each of these programmable controllers 30, 32 will be discussed in detail below. Indeed, a method of aligning and assembling each of these programmable controllers 30, 32 will be discussed along with the physical features of each component that facilitate such alignment and assembly. The programmable controllers 30, 32 illustrated in FIGS. 2 and 3 are representative embodiments of the programmable controller 14 described with respect to FIG. 1. Indeed, each of the programmable controllers 30, 32 illustrated in FIGS. 2 and 3 represents a specific embodiment of the programmable controller 14, which may be configured to monitor and/or control the process 16, as described above with respect to FIG. 1. Specifically, the programmable controller 30 illustrated in FIG. 2 is a 16-point module and the programmable controller 32 illustrated in FIG. 3 is a 12-point module. However, in other embodiments, it should be noted that different controller configurations and sizes may be employed in accordance with present techniques. Further, it should be noted that each of the illustrated programmable controllers 30, 32 has been constructed using various assembly components and procedural techniques in accordance with present embodiments, as will be discussed in detail below.

Figure 4:
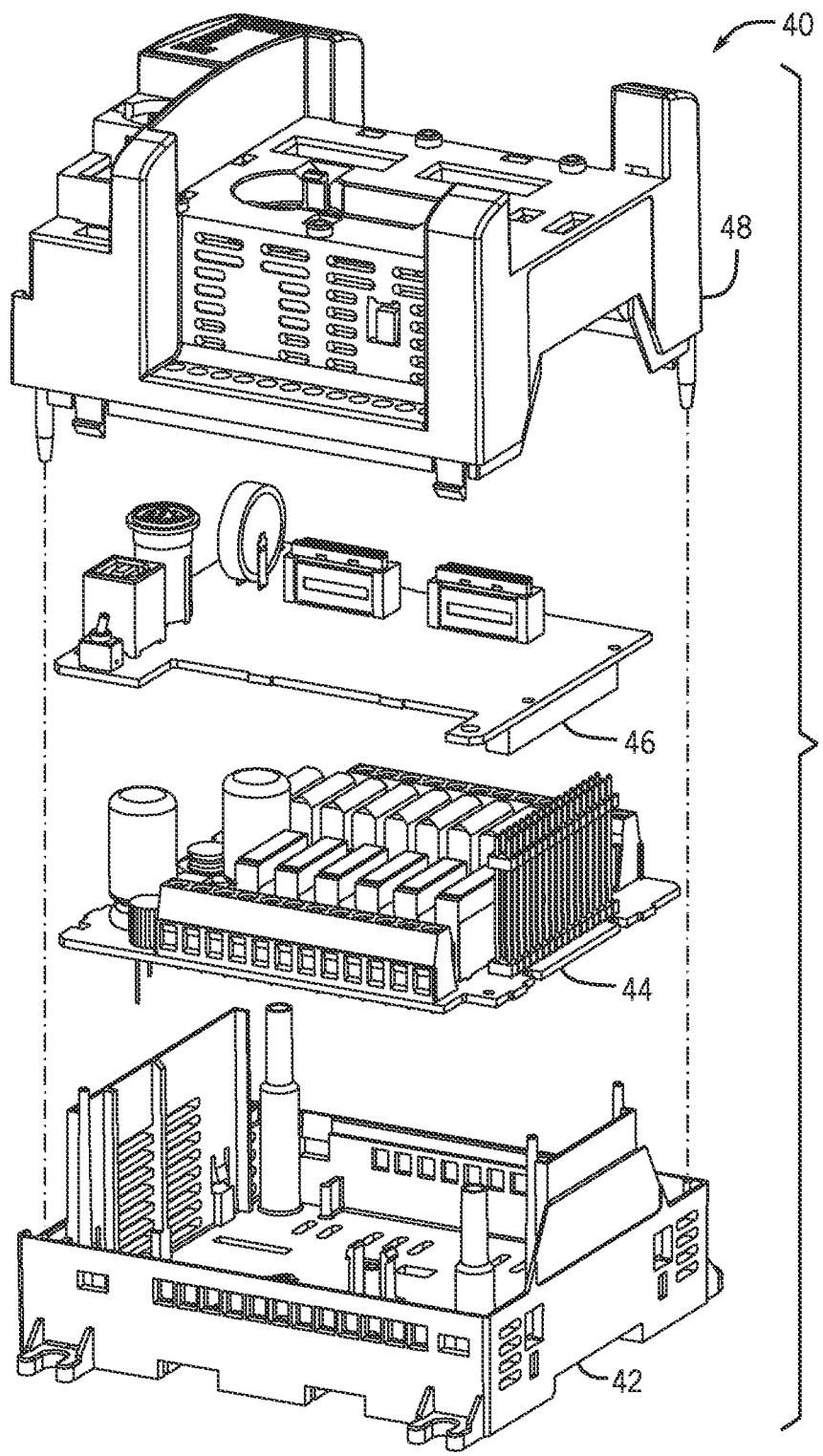
FIG. 4 is an exploded perspective view of the programmable controller illustrated in FIG. 2 in accordance with present embodiments.
Figure 5:
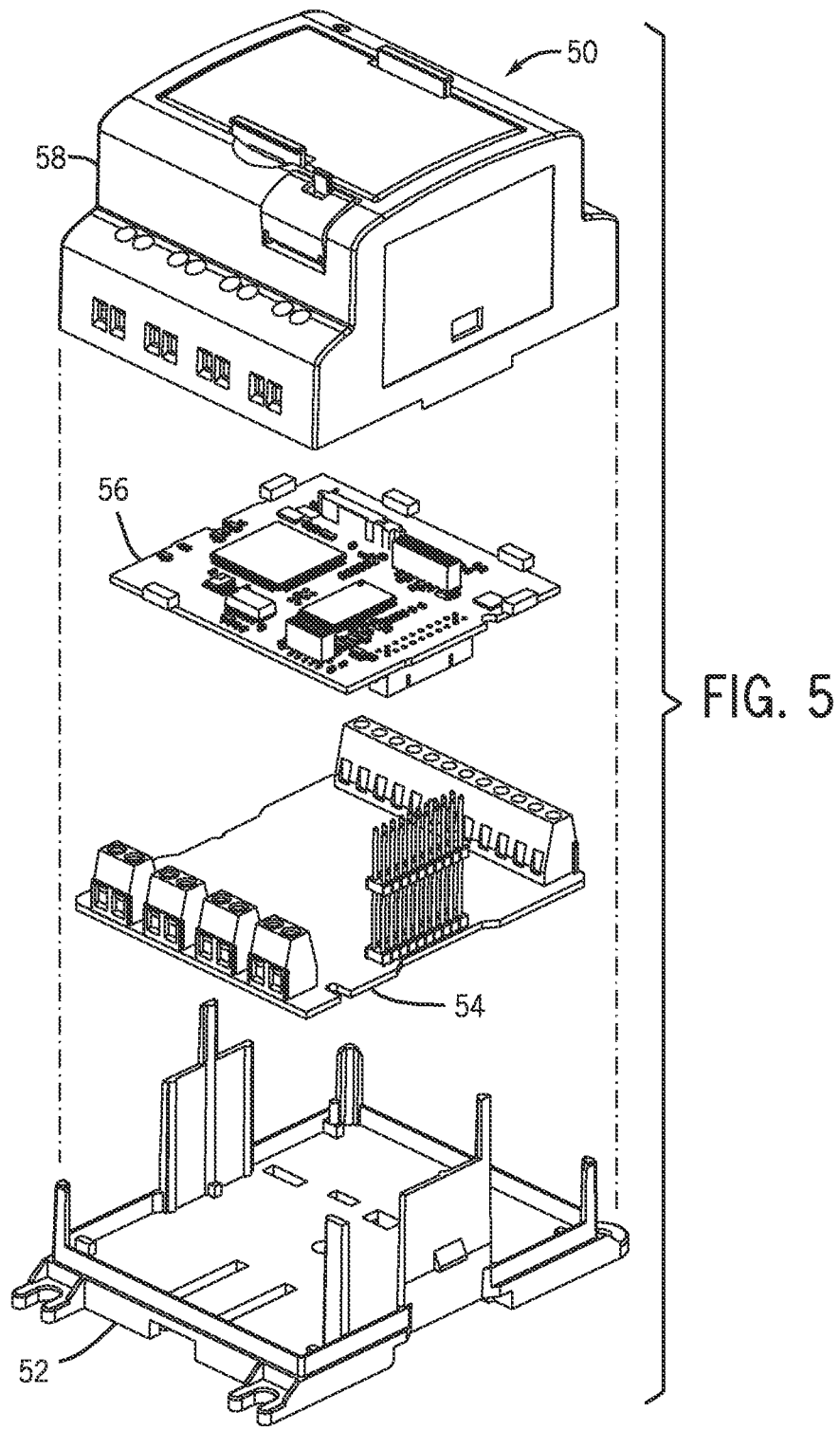
FIG. 5 is an exploded perspective view of the programmable controller illustrated in FIG. 3 in accordance with present embodiments.

Turning first to the programmable controller 30 of FIG. 2, an exploded perspective view of an assembly 40 that combines to form the programmable controller 30 is illustrated in FIG. 4. In the illustrated embodiment, the assembly 40 includes four main components. Specifically, the assembly 40 includes a bottom housing 42, an input/output (I/O) board 44, a central processing unit (CPU) board 46, and an upper housing 48. Similarly, an exploded perspective view of an assembly 50 is illustrated in FIG. 5, wherein the assembly is configured to combine to form the programmable controller 32 of FIG. 3. Much like the assembly 40, the assembly 50 includes a bottom housing 52, an I/O board 54, a CPU board 56, and an upper housing 58. Each of the illustrated assembly components in FIGS. 4 and 5 includes one or more features that facilitate alignment with respect to other components of the respective assembly. Further, multiple components of the illustrated assemblies 40, 50 include coupling features configured to hold the various components together once assembled. Specific features of the components of each of the assemblies 40, 50 will be discussed in detail below. It should be noted that, in some embodiments, different assortments of components may be included in different assemblies, such as assemblies 40, 50. For example, additional housing covers may be included and/or certain components, such as the I/O boards 44, 54, may be external to the assemblies 40, 50, and, thus, not integrated with the other assembly components.

Figure 6:
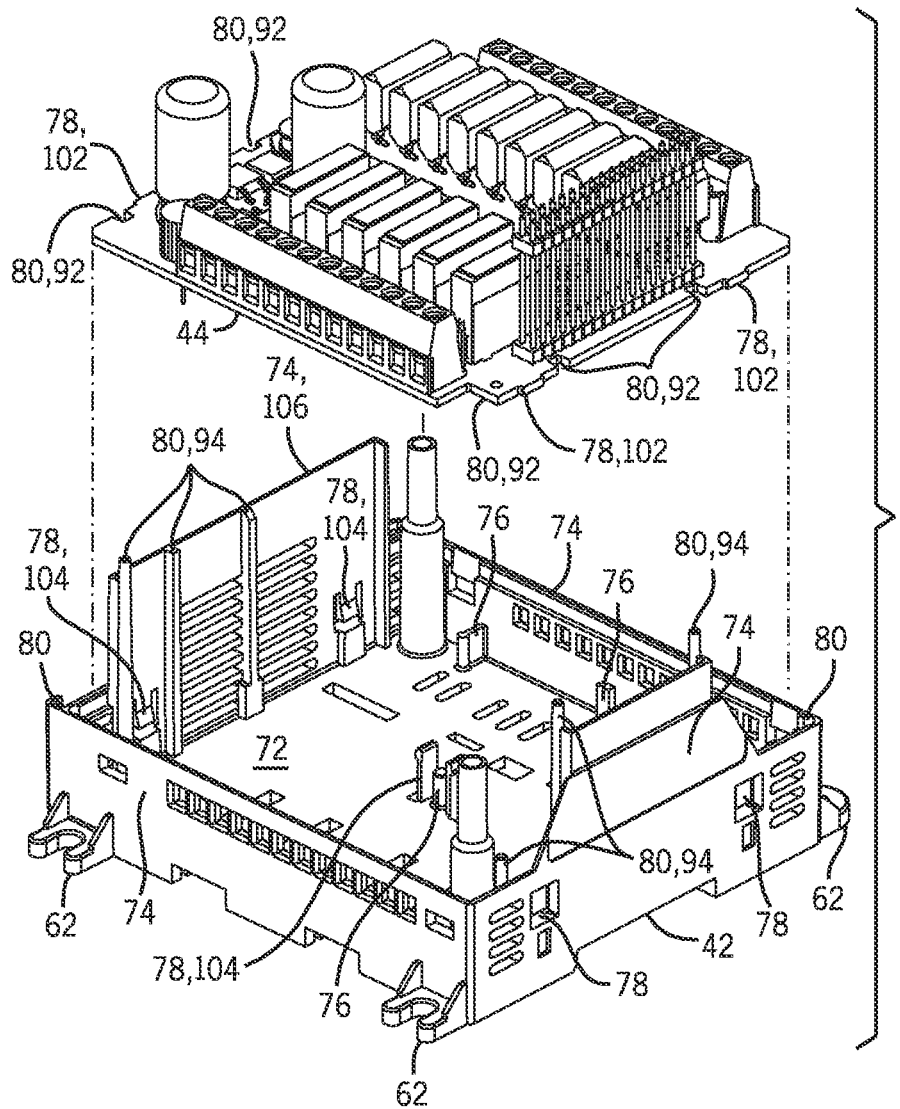
FIG. 6 is a perspective view of an I/O board positioned above and in alignment with a bottom housing of the programmable controller of FIG. 2 in accordance with present embodiments.
Figure 7:
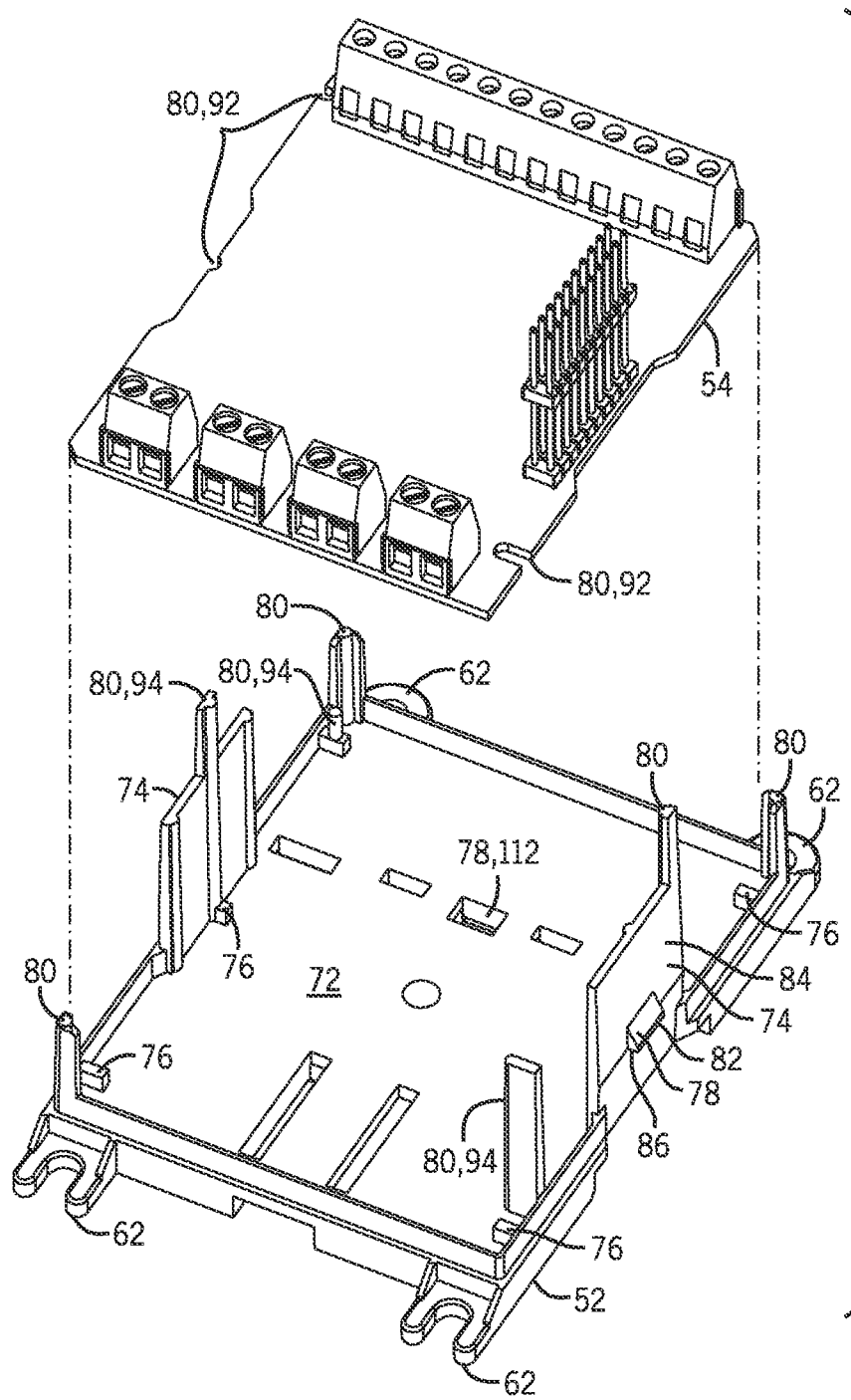
FIG. 7 is a perspective view of an I/O board positioned above and in alignment with a bottom housing of the programmable controller of FIG. 3 in accordance with present embodiments.

FIG. 6 is a perspective view of the I/O board 44 positioned above and in alignment with the bottom housing 42 in accordance with present embodiments. Similarly, FIG. 7 is a perspective view of the I/O board 54 positioned above and in alignment with the bottom housing 52 in accordance with present embodiments. The bottom housings 42, 52 each function as a foundation of their respective assemblies 40, 50 in accordance with present embodiments. Indeed, the bottom housings 42, 52 may operate as base support features of their respective assembled programmable controllers 30, 32, and as the base assembly piece to which all of the other related components are added during construction of the programmable controllers 30, 32. For example, with regard to operating as a foundational support feature, the bottom housings 42, 52 are each configured to couple with an external stay or support (e.g., a wall). Specifically, in the illustrated embodiments, the bottom housings 42, 52 each include a set of coupling features 62 (e.g., tabs with receptacles) that are designed to receive fasteners (e.g., screws) for coupling the bottom housings 42, 52 to a support structure (e.g., an interior wall of an electrical cabinet). Thus, the bottom housings 42, 52 enable coupling the corresponding programmable controllers 30, 32 to the support structure. Further, as partially illustrated in FIGS. 6 and 7, the respective bottom housings 42, 52 each function as a foundation during assembly of the various components. Indeed, the bottom housings 42, 52 are each the foundational component on which other components of their respective assemblies 40, 50 are serially stacked in accordance with present techniques. Further, the bottom housings 42, 52 each include various features that facilitate such a process of assembly by facilitating alignment and engagement with other components, as will be discussed further below.

As illustrated in FIGS. 6 and 7, the bottom housings 42, 52 each include a base 72, walls 74, supports 76, coupling features 78, and alignment features 80. The base 72 is generally planar in nature, and the walls 74, supports 76, coupling features 78, and alignment features 80 each generally extend away from the base 72 in a direction that is transverse to the base 72. That is, for example, an axis of each of these features may be arranged perpendicularly or substantially perpendicularly relative to the major plane of the base 72. It should be noted that terms such as transverse and perpendicularly are intended to include slight variations in orientation that will occur during manufacturing, assembly, and the like. Such terms are not intended to describe perfect geometric relationships. Further, certain aspects of the various features may extend in different directions. For example, a lip of a particular coupling feature 78 may extend away from a body of the coupling feature 78 in a direction substantially parallel to the base 72.

The various features of the bottom housings 42, 52 may be arranged or configured differently in different embodiments. In some embodiments certain features of the bottom housings 42, 52 may be integral with one another or formed separately. For example, the entire bottom housing 42 may be formed from a single mold or assembled from various different components. In some embodiments, certain features may be considered integral with one another and may act as combined features (e.g., a single feature may perform an alignment and coupling function). Indeed, the walls 74 may be integral with certain supports 76, coupling features 78, and alignment features 80. For example, as illustrated in FIG. 7, a coupling feature 82 is integral with a wall 84 of the bottom housing 52. Likewise, an alignment feature 80 may include aspects that perform a coupling function. It should also be noted that the coupling feature 82 includes a lip 86 that generally extends in a direction parallel to the base 72, while the wall 84, which functions as a body of the coupling feature 82, extends in a direction perpendicular to the base 72. Further, certain features may not directly extend from the base 72. For example, rather than extend directly from the base 72, certain supports 76, coupling features 78, and alignment features 80 may extend from one of the walls 74 that is coupled to or integral with the base 72.

FIGS. 6 and 7 also illustrate the I/O boards 44, 54 with integral alignment features 80 in accordance with present embodiments. Specifically, each of the I/O boards 44, 54 includes receptacles 92 that are configured to engage with projections 94 from the respective bottom housings 42, 52. The projections 94 may include varying cross-sectional shapes (e.g., round, square, and asymmetric) and may include features to facilitate alignment or coupling. For example, in the illustrated embodiments, some projections 94 include a tapered end to further guide the receptacles 92 into engagement with the projections 94. In other embodiments, different types of alignment features 80 may be employed. The receptacles 92 include holes and/or gaps that are capable of aligning with the projections 94 and sliding down the projections 94 such that the respective I/O boards 44, 54 are positioned adjacent the respective bottom housings 42, 52. Specifically, the receptacles 92 slide along the projections 94 until a bottom portion of each I/O board 44, 54 engages with one or more of the corresponding supports 76. The projections 94 extend such that an assembler (e.g., a technician) can easily align them with the receptacles 92. Indeed, an assembler can essentially feel the location of the alignment features 80 without looking. Further, the receptacles 92 and projections 94 are arranged asymmetrically about the respective I/O boards 44, 54 and bases 72 to provide orientation. This resists assembly in a reverse or incorrect orientation, which could occur if the alignment features 80 were arranged symmetrically. Further, this asymmetry enables a blind assembly or an assembly without requiring a visual check for proper orientation and alignment.

Figure 8:
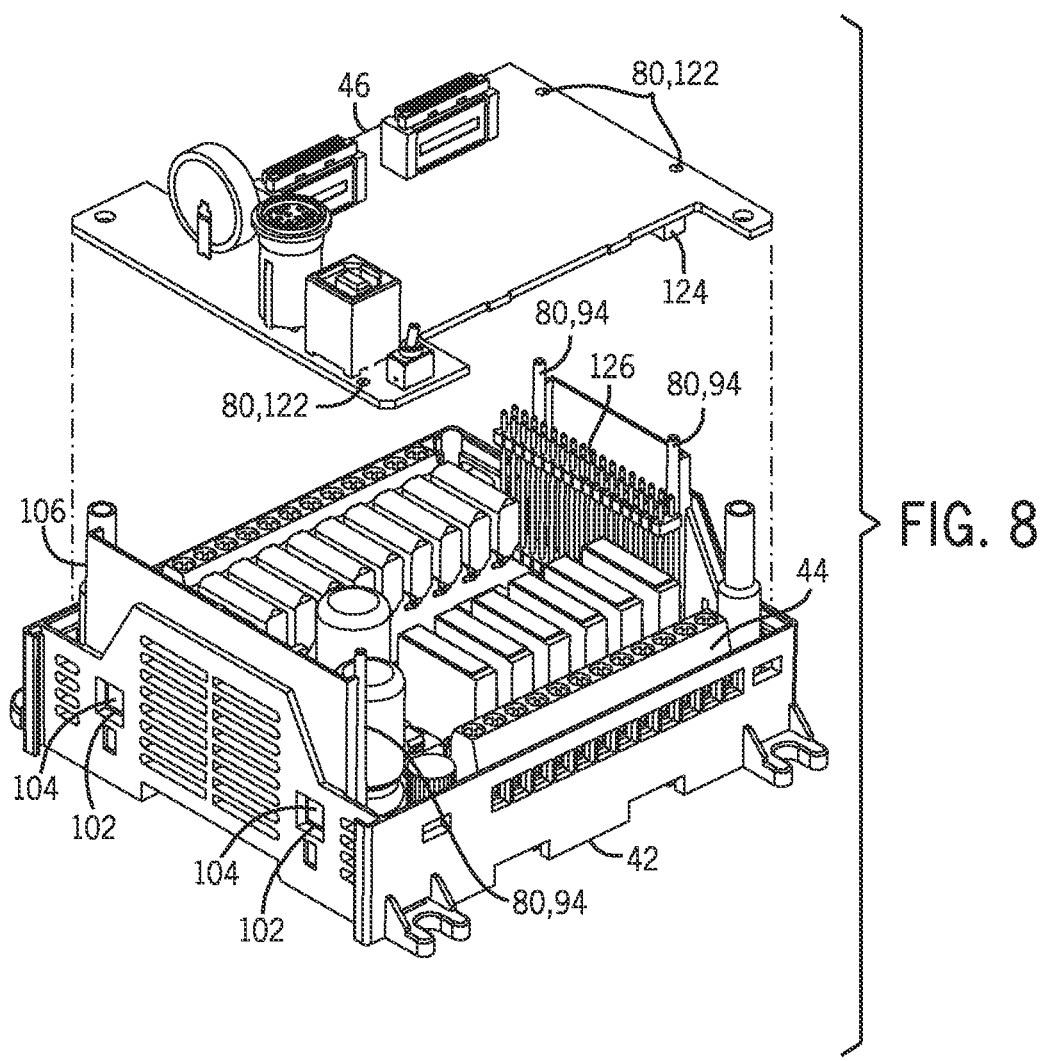
FIG. 8 is a perspective view of a CPU board positioned above and aligned with an I/O board and a bottom housing of the programmable controller of FIG. 2 in accordance with present embodiments.
Figure 9:
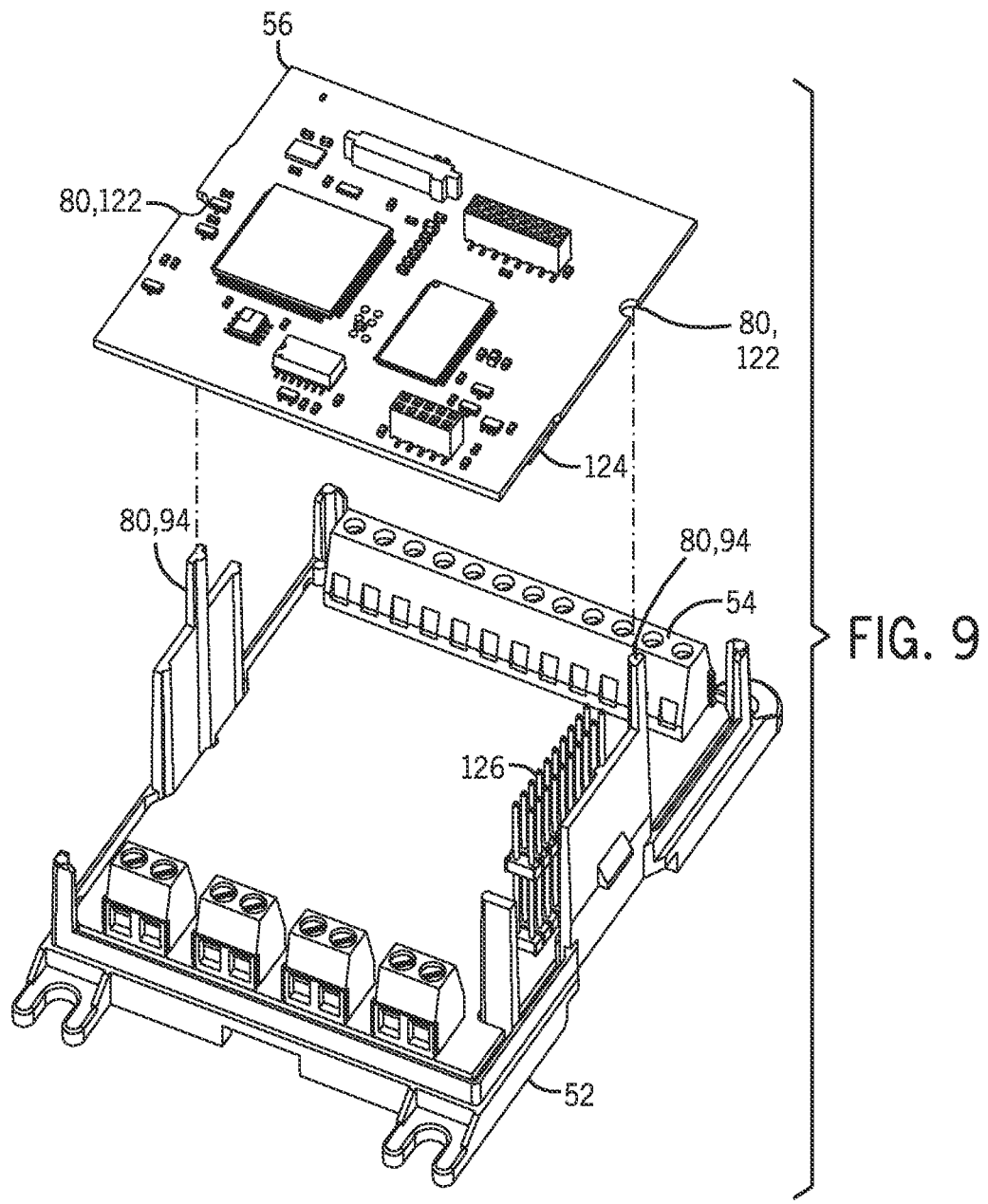
FIG. 9 is a perspective view of a CPU board positioned above and aligned with an I/O board and a bottom housing of the programmable controller of FIG. 3 in accordance with present embodiments.

FIGS. 8 and 9 illustrate the I/O boards 44, 54 assembled with the respective bottom housings 42, 52. In this assembled condition, the I/O boards 44, 54 and bottom housings 42, 52 may be coupled together or simply abutting one another. For example, the I/O board 44 includes coupling features 78 in the form of tabs 102 extending from edges of the I/O board 44, as illustrated in FIG. 6. In FIG. 8, these tabs 102 are engaged with snaps 104 of the bottom housing 42. When the receptacles 92 of the I/O board 44 are engaged with the projections 94 and the I/O board 44 is sliding into engagement with the bottom housing, the tabs 102 push the snaps 104, which are cantilevered from a wall 106, away from the base 72 so that the tabs 102 slide past the snaps 104 and the snaps 104 can flex back into place over the tabs 102 once the I/O board 44 is engaged with the bottom housing 42. Lips of the snaps 104 then function to assist in holding the I/O board 44 in place relative to the bottom housing 42. Similarly, snaps 104 extending from the base 72 of the bottom housing 42 pass through holes in the I/O board 44 and flex such that corresponding lips engage an upper surface of the I/O board 44 adjacent each hole. Thus, FIG. 8 illustrates the I/O board 44 coupled in various ways to the bottom housing 42. It should be noted that some embodiments may include coupling features 78 (e.g., snaps 104) extending down from a bottom portion of the I/O boards 44, 54 that engage with receptacles in the base 72, such as hole 112 in FIG. 7. In other embodiments, the I/O board 44 may not be held in place by such coupling features 78. For example, FIG. 9 may illustrate such an embodiment.

FIGS. 8 and 9 also illustrate perspective views of the CPU boards 46, 56 positioned above and aligned with the respective I/O boards 44, 54 and the bottom housings 42, 52 in accordance with present embodiments. As previously discussed, the bottom housings 42, 52 each function as a foundation of their respective assemblies 40, 50. Indeed, the bottom housings 42, 52 are each the foundational component on which other components of their respective assemblies 40, 50 are serially stacked. In accordance with present embodiments, an assembler can put together the respective assemblies 40, 50 without flipping, turning, or moving the bottom housings 42, 52 around during the assembly process. This simplifies and improves the assembly time relative to traditional procedures. For example, a traditional assembly process for a programmable controller may take approximately 200 seconds, while assembly in accordance with present embodiments may take less than 45 seconds.

Each of the CPU boards 46, 56 includes alignment features 80 that cooperate with alignment features 80 of the respective bottom housings 42, 52. Specifically, each of the CPU boards 46, 56 includes receptacles 122 that are configured to engage with the projections 94 from the respective bottom housings 42, 52. However, in other embodiments, the receptacles 122 may engage with alignment features 80 of the respective I/O boards 44, 54. Further, in some embodiments, different types of alignment features 80 may be employed. It should also be noted that some alignment features 80 that were previously used to align the bottom housings 42, 52 with the respective I/O boards 44, 54 may be used as supports 76 for the respective CPU boards 46, 56.

In the illustrated embodiments, the receptacles 122 include holes and/or gaps that are capable of aligning with the projections 94 and sliding down the projections 94 such that the CPU boards 46, 56 engage with the respective I/O boards 44, 54. Specifically, the receptacles 122 slide along the projections 94 until a mating feature or connector 124 of each CPU board 46, 56 couples with a respective mating feature on connector 126 of each I/O board 44, 54 to facilitate electronic communication between them. Once engaged, the connectors 124, 126 provide coupling between the respective CPU boards 46, 56 and I/O boards 44, 54. However, in some embodiments, additional coupling features 78 may be employed. For example, the CPU boards 46, 56 may include tabs, snaps, receptacles, or the like that coordinate with corresponding features of the respective I/O boards 44, 54 and/or bottom housings 42, 52.

The projections 94 extend such that an assembler can easily align the projections 94 with the receptacles 122 and such that the respective CPU boards 46, 56 and I/O boards 44, 54 are properly aligned before the respective connectors 124, 126 engage one another. This preliminary alignment of components may resist bending or breaking of connector features, such as pins of the connector 126, during mating of the connectors 124, 126. Indeed, by employing the alignment features 80, the pins will be aligned with corresponding pin receptacles of the connector 124 and horizontal movement of the connectors 124, 126 relative to one another that could cause damage to the pins during coupling of the connectors 124, 126 will be resisted by the alignment features 80. Further, as discussed above, the alignment features 80 enable blind assembly and are arranged asymmetrically about the respective components to provide a proper orientation guide.

Figure 10:
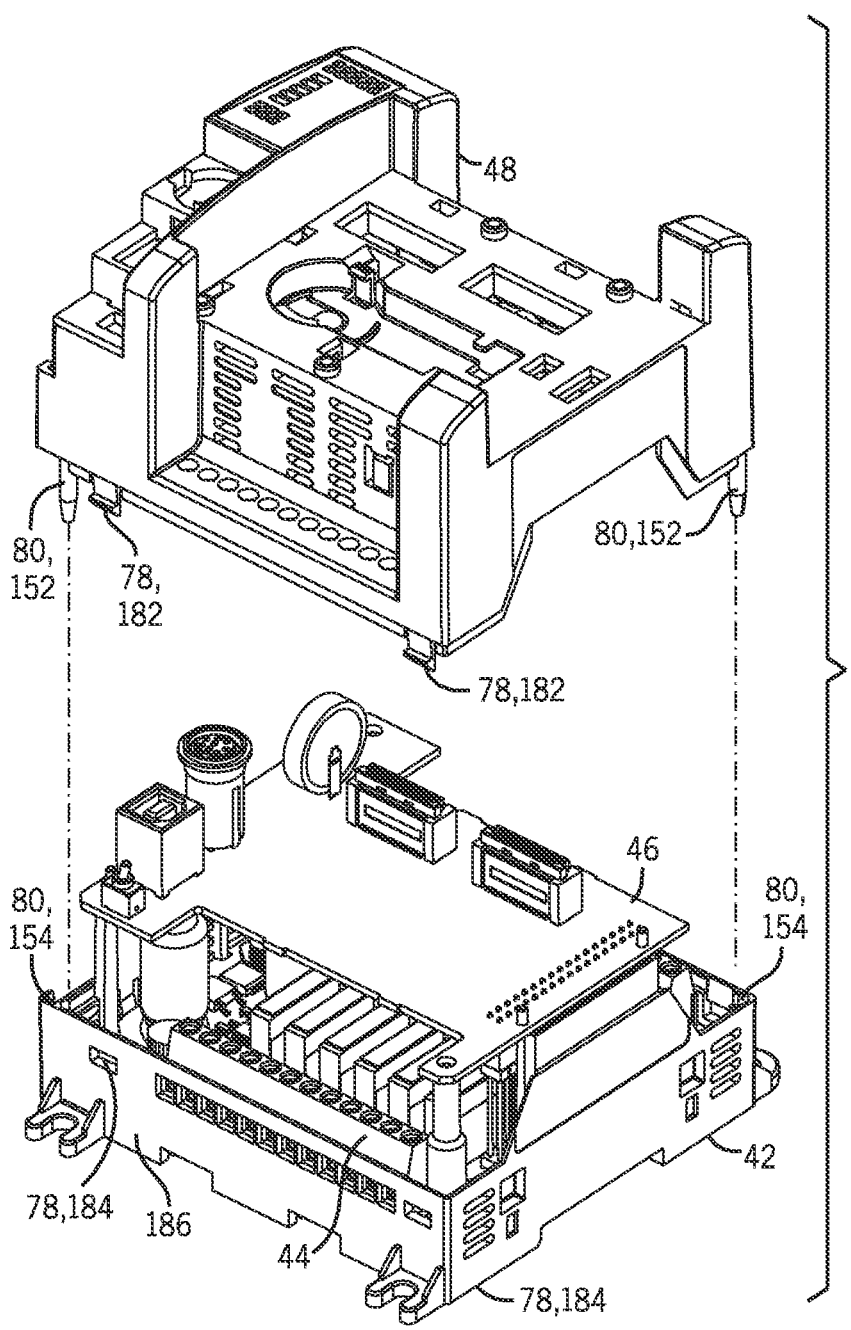
FIG. 10 illustrates an upper housing positioned over and aligned with the CPU board, I/O board, and bottom housing of the programmable controller of FIG. 2 in accordance with present embodiments.
Figure 11:
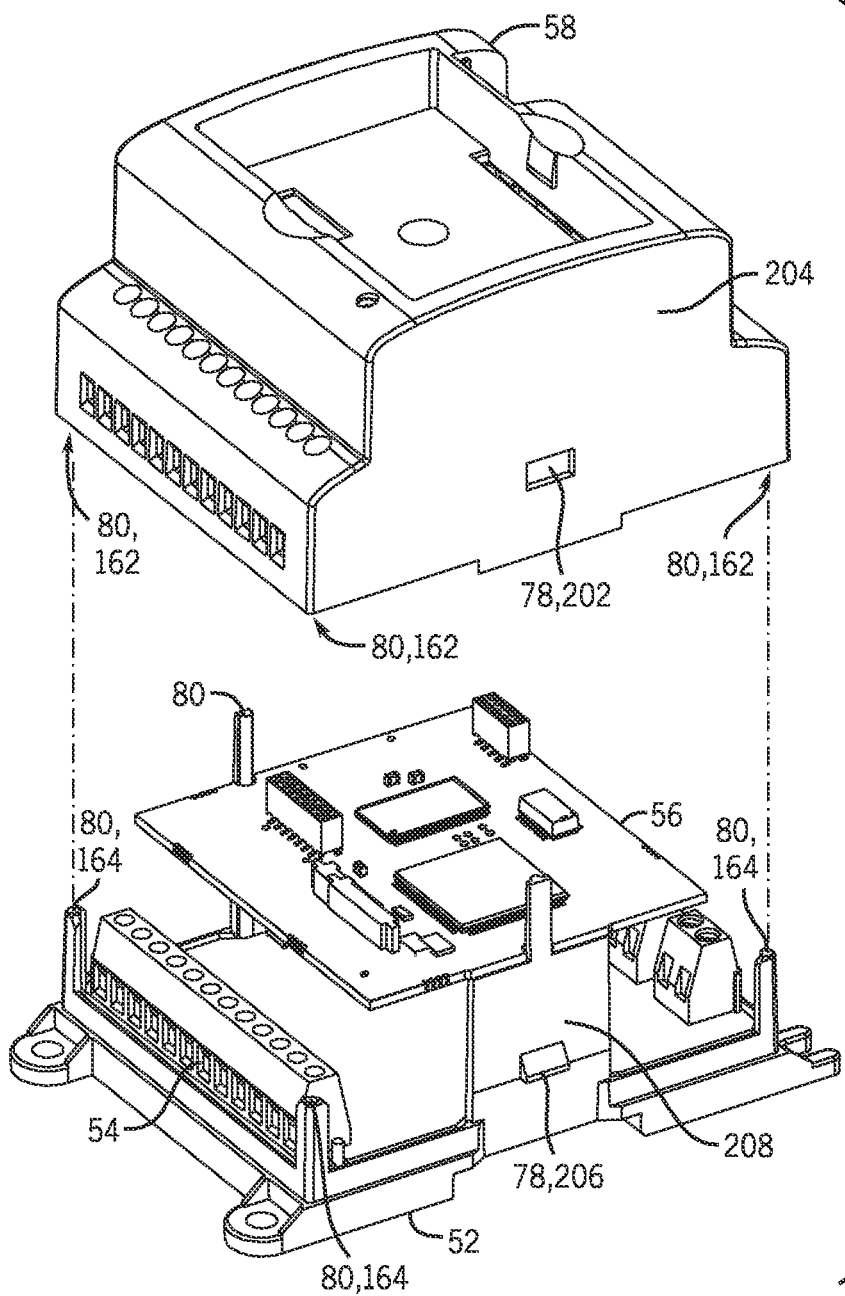
FIG. 11 illustrates an upper housing positioned over and aligned with the CPU board, I/O board, and bottom housing of the programmable controller of FIG. 3 in accordance with present embodiments.

FIGS. 10 and 11 illustrate the upper housings 48, 58 positioned over and aligned with the respective CPU boards 46, 56, I/O boards 44, 54, and bottom housings 42, 52 for each assembly 40, 50. Once the components of FIGS. 10 and 11 are assembled, the completed programmable controllers 30, 32 may be provided, respectively. In the illustrated embodiments, the I/O boards 44, 54 have been engaged with the respective bottom housings 42, 52 using the alignment features 80 and the coupling features 78 as previously discussed, and the CPU boards 46, 56 have then been engaged to the respective I/O boards 44, 54 using the alignment features 80 and coupling features 78 as previously discussed. Further, as illustrated by FIGS. 10 and 11, the upper housings 48, 58 of each assembly 40, 50 are about to be attached to the other components to essentially complete the construction of corresponding programmable controllers 30, 32 using alignment features 80 and coupling features 78.

As illustrated in FIGS. 10 and 11, the upper housings 48, 58 each include alignment features 80 and coupling features 78. Specifically, in FIG. 10, the upper housing 48 includes projections 152 that are configured to engage elongate channels 154 of the bottom housing 42. In contrast, the upper housing 58 illustrated in FIG. 11 includes elongate channels 162 configured to engage projections 164 of the bottom housing 52. The elongate channels 154, 162 may be symmetrical receptacles (e.g., holes, grooves, or adjacent lips) that are positioned asymmetrically relative to one another and/or asymmetrically shaped receptacles (e.g., a single lip extending along a length of a wall near a corner). The projections 152, 164 may be shaped and positioned to correspond to the respective elongate channels 154, 162. By arranging such alignment features 80 asymmetrically and/or providing asymmetric shapes, the alignment features 80 facilitate blind assembly and proper orientation, as discussed above.

Figure 12:
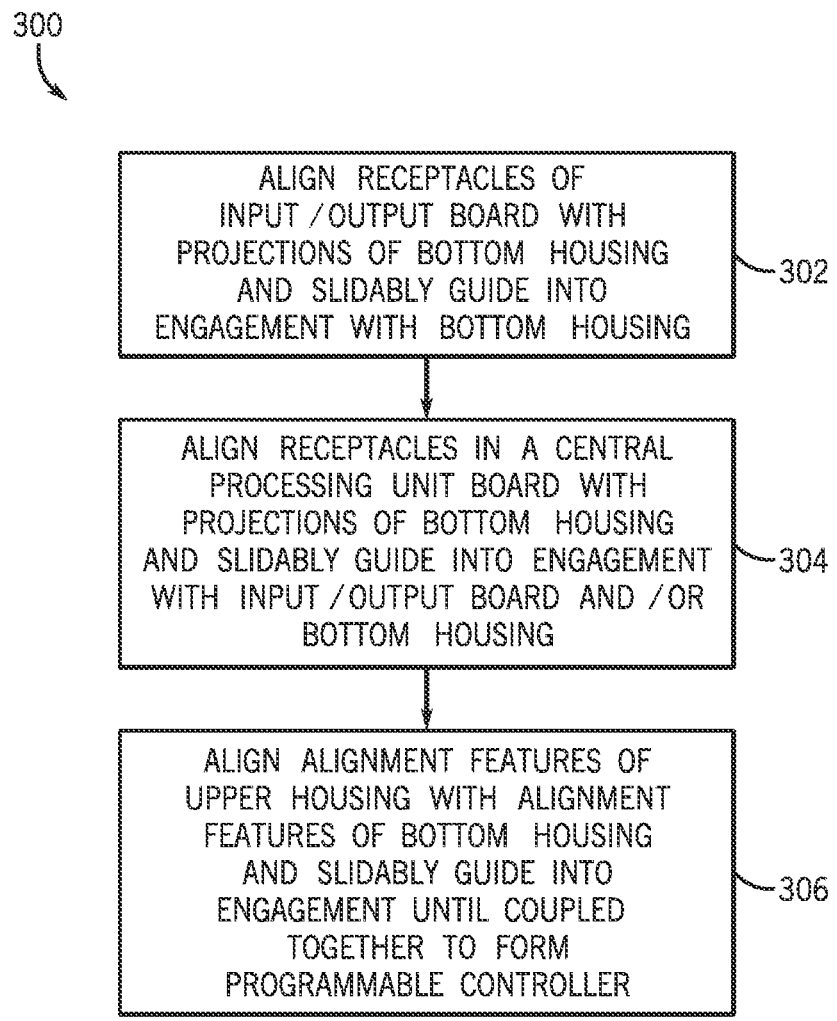
FIG. 12 is a process flow diagram of a method in accordance with present embodiments.

The upper housings 48, 58 also each include coupling features 78. Specifically, in FIG. 12, the upper housing 48 includes snaps 182 that are cantilevered from a bottom portion of the upper housing 48. These snaps 182 flex upon contact with an upper edge of openings 184 in a wall 186 of the bottom housing 42 and then flex back when a lip of each of the snaps 182 enters a respective one of the openings 184 to engage the openings 184 and hold the upper housing 48 together with the bottom housing 42. It should be noted that different coupling features may be utilized in different embodiments. For example, the upper housing 58 illustrated in FIG. 11 includes a receptacle 202 disposed in a side wall 204 as a coupling feature 78. The receptacle 202 is positioned to engage a snap 206 extending from a side wall 208 of the bottom housing 52. The side wall 204 may flex to pass over the snap 206 until it flexes back into place when the snap 206 engages the receptacle 202 to hold the upper housing 58 in position relative to the bottom housing 52. While not shown, a corresponding snap and receptacle may be included on the opposite side of the assembly 50. Further, it should be noted that the various coupling features 78 of the upper housings 48, 58 and the bottom housings 42, 52 may be positioned asymmetrically to facilitate proper orientation of the components.

FIG. 2 is a block diagram of a method or process 300 for assembling a programmable logic controller in accordance with present embodiments. The process 300 begins with block 302, which represents aligning at least two receptacles in an input/output board with at least two projections extending in a transverse (e.g., perpendicular) direction from a base of a bottom housing and guiding the input/output board slidably along the at least two projections until it is engaged with the bottom housing. This may be performed by alignment features of components in accordance with present embodiments. Next, block 304 represents aligning at least two receptacles in a circuit board of a central processing unit with at least two alignment projections extending from the bottom housing in a direction transverse to the base. This may be performed by alignment features in accordance with present embodiments. The two alignment projections utilized in block 304 may be the same projections used in block 302. It should be noted that the alignment projections are positioned asymmetrically with respect to the base to facilitate proper orientation of components with respect to one another. Once aligned, the at least two alignment projections may slidably guide the central processing unit until a connector of the input/output board couples with a connector of the central processing unit to provide communication between the two boards. Finally, block 306 represents aligning at least two alignment features of an upper housing with at least two alignment features of the bottom housing, and directing the upper housing slidably along the at least two alignment features of the bottom housing until a coupling feature of the upper housing interlocks with a coupling feature of the bottom housing. Again, the same alignment features may be utilized and the alignment features may be asymmetrically positioned with respect to the base. Thus, a complete programmable controller may be assembled blindly and without the use of tools. It should also be noted that the use of integral coupling features limits the number of required parts, which reduces costs relative to traditional assemblies.

As will be appreciated by those skilled in the art, the above described implementations may be appropriately scaled and/or reinforced based upon the size of the programmable controllers and components. The techniques described above provide an assembly process for connecting components or modules of a programmable controller while providing substantial cost savings achieved by reduced number of mechanical parts required for the coupling features or locking mechanisms.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A programmable logic controller, comprising:
a bottom housing comprising a base, a first plurality of alignment features, and a first plurality of attachment features;
an upper housing comprising a second plurality of alignment features and a second plurality of attachment features, wherein a first pair of the second plurality of alignment features are slidably engaged with a first pair of the first plurality of alignment features and wherein the first pair of the first plurality of alignment features are asymmetrically positioned relative to the base, and wherein a first pair of the first plurality of attachment features is coupled with a first pair of the second plurality of attachment features; and a central processing unit board positioned between the lower housing and the upper housing, the central processing unit board comprising a first pair of receptacles coupled about a second pair of the first plurality of alignment features, wherein the second pair of the first plurality of alignment features are asymmetrically positioned relative to the base.

2. The programmable logic controller of claim 1, comprising an input/output board positioned between the lower housing and the upper housing, the input/output board comprising a second pair of receptacles coupled about a third pair of the first plurality of alignment features, wherein the third pair of the first plurality of alignment features are asymmetrically positioned relative to the base.

3. The programmable logic controller of claim 2, wherein the central processing unit board or the input/output board comprises a pair of tabs extending asymmetrically from edges that engage a second pair of the first plurality of attachment features.

4. The programmable logic controller of claim 3, wherein the second pair of the first plurality of attachment features comprise snap features extending along walls of the lower housing.

5. The programmable logic controller of claim 1, wherein the first and second pairs of the first plurality of alignment features are the same alignment features.

6. The programmable logic controller of claim 1, wherein the first pair of the first plurality of attachment features is a pair of pins and the first pair of the second plurality of attachment features is a pair of sockets.

7. The programmable logic controller of claim 1, wherein the first pair of the second plurality of alignment features comprise projections that are slidably engaged with elongate receptacles of the first pair of the first plurality of alignment features.

8. The programmable logic controller of claim 1, wherein the first pair of the first plurality of attachment features is a pair of tabs cantilevered from the bottom housing and the first pair of the second plurality of attachment features is a pair of openings in the upper housing.

9. The programmable logic controller of claim 8, wherein the pair of openings extend through the upper housing.

10. The programmable logic controller of claim 1, wherein at least one of the first or second plurality of alignment features comprises a protrusion with an asymmetric cross-section.

11. A programmable controller, comprising:
a bottom housing comprising a first plurality of attachment features;
a first plurality of alignment features extending from the bottom housing;
an upper housing comprising a second plurality of attachment features configured to couple with the first plurality of attachment features;
a second plurality of alignment features extending from the upper housing;
a first pair of the second plurality of alignment features configured to slidably engage a second pair of the first plurality of alignment features, wherein the first pair of the first plurality of alignment features are asymmetrically positioned relative to a base of the bottom housing; and a central processing unit positioned between the lower housing and the upper housing, the central processing unit comprising at least one receptacle configured to receive at least one of the first or second plurality of alignment features.

12. The programmable controller of claim 11, wherein the at least one receptacle comprises a pair of receptacles configured to receive a pair of the first plurality of alignment features.

13. The programmable controller of claim 12, wherein the pair of the first plurality of alignment features are asymmetrically positioned relative to the base.

14. The programmable controller of claim 11, wherein the first plurality of alignment features extend from the base of the bottom housing.

15. The programmable controller of claim 11, wherein the central processing unit comprises a circuit board.

16. The programmable controller of claim 11, wherein at least two of the first plurality of alignment features comprise different cross-sectional geometries.

17. The programmable controller of claim 11, wherein the receptacle comprises an indentation in an edge of a board of the central processing unit.

18. The programmable controller of claim 11, wherein the receptacle comprises a hole extending completely through the board of the central processing unit.

19. A method of assembling a programmable logic controller, comprising:
aligning at least two receptacles in an input/output board with at least two alignment projections extending from a base of a bottom housing in a direction transverse to the base, wherein the at least two alignment projections are positioned asymmetrically with respect to the base;
directing the input/output board slidably along the at least two alignment projections until components of the input/output board engage with abutment or coupling features of the bottom housing;
aligning at least two receptacles in a central processing unit board with at least two projections extending from the base and directing the central processing unit board slidably along the at least two projections until a connector of the input/output board couples with a connector of the central processing unit board;
aligning at least two alignment features of an upper housing with at least two alignment features of the bottom housing;
directing the upper housing slidably along the at least two alignment features of the bottom housing until a coupling feature of the upper housing interlocks with a coupling feature of the bottom housing, wherein the at least to alignment features of the bottom housing are asymmetrically positioned with respect to the base.

20. The method of claim 19, comprising receiving a pair of tabs of the circuit board or the input/output board into engagement with a pair of snap features extending along a wall of the bottom housing and asymmetrically positioned with respect to the base.

* * * * *